(12) United States Patent
Liu

(10) Patent No.: US 8,723,016 B2
(45) Date of Patent: May 13, 2014

(54) LOW PROFILE SOLAR CONCENTRATOR

(75) Inventor: Yue Liu, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 760 days.

(21) Appl. No.: 12/814,924

(22) Filed: Jun. 14, 2010

(65) Prior Publication Data

US 2011/0011441 A1    Jan. 20, 2011

Related U.S. Application Data

(60) Provisional application No. 61/270,852, filed on Jul. 14, 2009.

(51) Int. Cl.
*H01L 31/042* (2014.01)
(52) U.S. Cl.
USPC ............ 136/246; 136/245; 136/251; 136/259
(58) Field of Classification Search
USPC .......................................... 136/246, 251, 259
See application file for complete search history.

(56) References Cited

U.S. PATENT DOCUMENTS

| | | | |
|---|---|---|---|
| 3,299,306 A * | 1/1967 | Kapany | 313/524 |
| 4,180,414 A | 12/1979 | Diamond et al. | |
| 4,243,019 A | 1/1981 | Severson | |
| 4,419,532 A | 12/1983 | Severns | |
| 6,248,949 B1 | 6/2001 | Turner | |
| 7,381,886 B1 | 6/2008 | Aiken et al. | |
| 7,638,708 B2 | 12/2009 | Fork et al. | |
| 2008/0264486 A1 * | 10/2008 | Chen et al. | 136/259 |
| 2009/0067784 A1 * | 3/2009 | Ghosh et al. | 385/33 |

* cited by examiner

*Primary Examiner* — Thanh-Truc Trinh
(74) *Attorney, Agent, or Firm* — Seager Tufte & Wickhem LLC.

(57) ABSTRACT

A low profile solar collector having a number of light collecting lenses that fit closely together as an array on a flexible sheet. The lenses may focus light onto optical conveyance mechanisms which convey light from the lenses to a light-to-electrical converter or converters at an edge of the sheet. The lenses may alternatively focus light onto a light-to-electrical converter or converters. Conductors may convey electricity from the light-to-electrical converters to an electrical connection block at an edge of the sheet. The flexible sheet may be rolled, folded, or form fitted onto a non-planar surface. Two or more low profile solar collectors having a number of collecting lenses may be combined to form a larger sheet for solar collection. The electrical outputs of the collectors may be connected to provide one or more outputs as desired.

14 Claims, 7 Drawing Sheets

US 8,723,016 B2

LOW PROFILE SOLAR CONCENTRATOR

The present application claims the benefit of U.S. Provisional Patent Application No. 61/270,852, filed Jul. 14, 2009, and entitled "Low Profile Solar Concentrator". U.S. Provisional Patent Application No. 61/270,852, filed Jul. 14, 2009, is hereby incorporated by reference.

BACKGROUND

The invention pertains to solar energy, and particularly to collection of solar energy. More particularly, the invention pertains to mechanisms for collecting and converting solar energy.

SUMMARY

The invention is a low profile solar collector. The collector may have a number of collecting lenses that fit closely together as an array on a flexible sheet. The lenses may focus light onto optical conveyance mechanisms, such as optical waveguides, which convey light from the collector lenses to a light-to-electrical converter or converters, such as photovoltaic cells or solar cells, at an edge of the sheet. The lenses may alternatively focus light onto light-to-electrical converters. Conductors may convey electricity from the light-to-electrical converters to an electrical connection block at an edge of the sheet. The flexible sheet may be rolled, folded, or form fitted onto a non-planar surface. Two or more low profile solar collectors having a number of collecting lenses may be combined to form a large sheet for solar collection.

DESCRIPTION

Many of the current solar concentrator structures used in large scale solar Photovoltaic (PV) power conversion implementations may use bulk optics on the order of several inches to feet or meters.

While it may be possible to miniaturize a solar concentrator structure in a portable scale, the shape may be in a typical bulky volumetric form, that is, typically may imply similar thicknesses and lateral dimensions. It is not easy or apparent to implement solar concentrator structure in a large area sheet, or as an easy to carry package or with flexible form factor.

The present approach may involve creating a solar light collection system in an optical domain. The system may be laterally scaled, without increasing the thickness, and without significantly increasing the size of a PV (photovoltaic) cell (optical to electrical conversion device). The end result may be an envisioning of the solar concentrator in a "sheet" form, which can be flexible, lightweight, and rugged, and can collect light in a large area form, and "fold" the collected light "within" the collector "sheet" (e.g., to an edge) with increased intensity, and then convert the light to electrical power using a narrow strip of solar PV cells (having reduced overall system cost) at the edge (e.g., side bar) of the collector sheet.

The present approach may distinctive structural features. It may have a low f# (e.g., <1) but smaller size collecting lens (diameter D 51 in ~mm range, e.g., 10 to 30 mm in size) implemented in lightweight plastic (having a small focal length h 52 to a focal point 12). For the low profile, one may have "h<D". There may be a lens coupled with a high NA (e.g., a numerical aperture ≥0.5) waveguide (glass or plastic) to "pipe" the light sideways, with low profile (focal length of the lens 11 to point 12 in FIG. 1). There may be a staggered 2D lens array, and 1D waveguide (WG) array to form a light collector "sheet" with a relatively large area but having a small overall profile. The light output may be concentrated to the side of the sheet and be coupled into a narrow strip of high efficiency (that may be crystalline) solar cells.

The optical collector sheet may be implemented using lightweight optical materials that are flexible, rugged and not electrically connecting (i.e., non-conducting). Energy conversion may take place within a narrow area at the edge of the sheet, and minimize the use of expensive crystalline semiconductor (e.g., Si, Ge, GaAs, InGaP or their combinations of multi-junction) solar cells.

Figure 5:
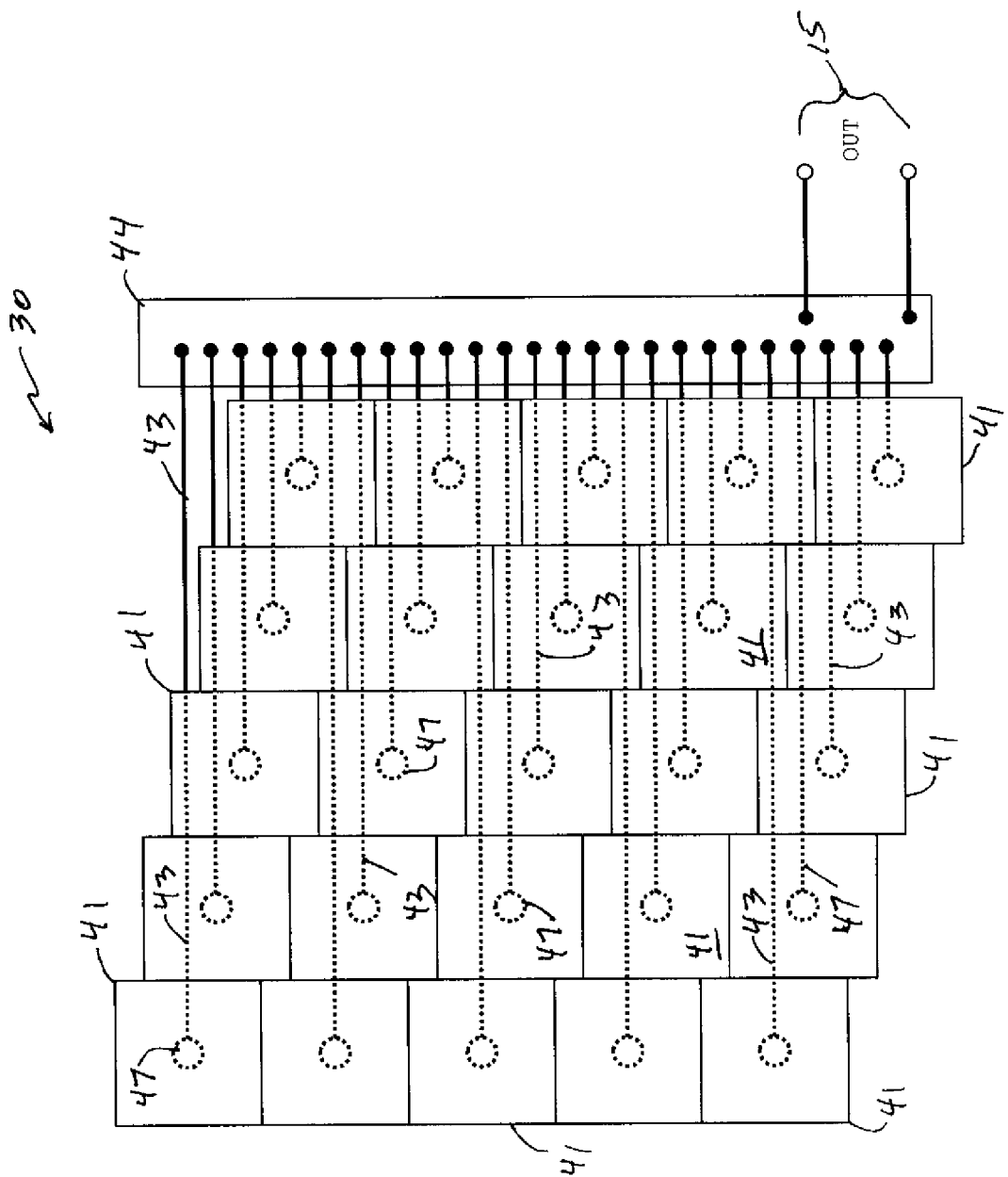
FIG. 5 is a diagram of an example array having square collector lenses having a light collection and conversion configuration different than that for the collector sheet in FIG. 1.
Figure 6:
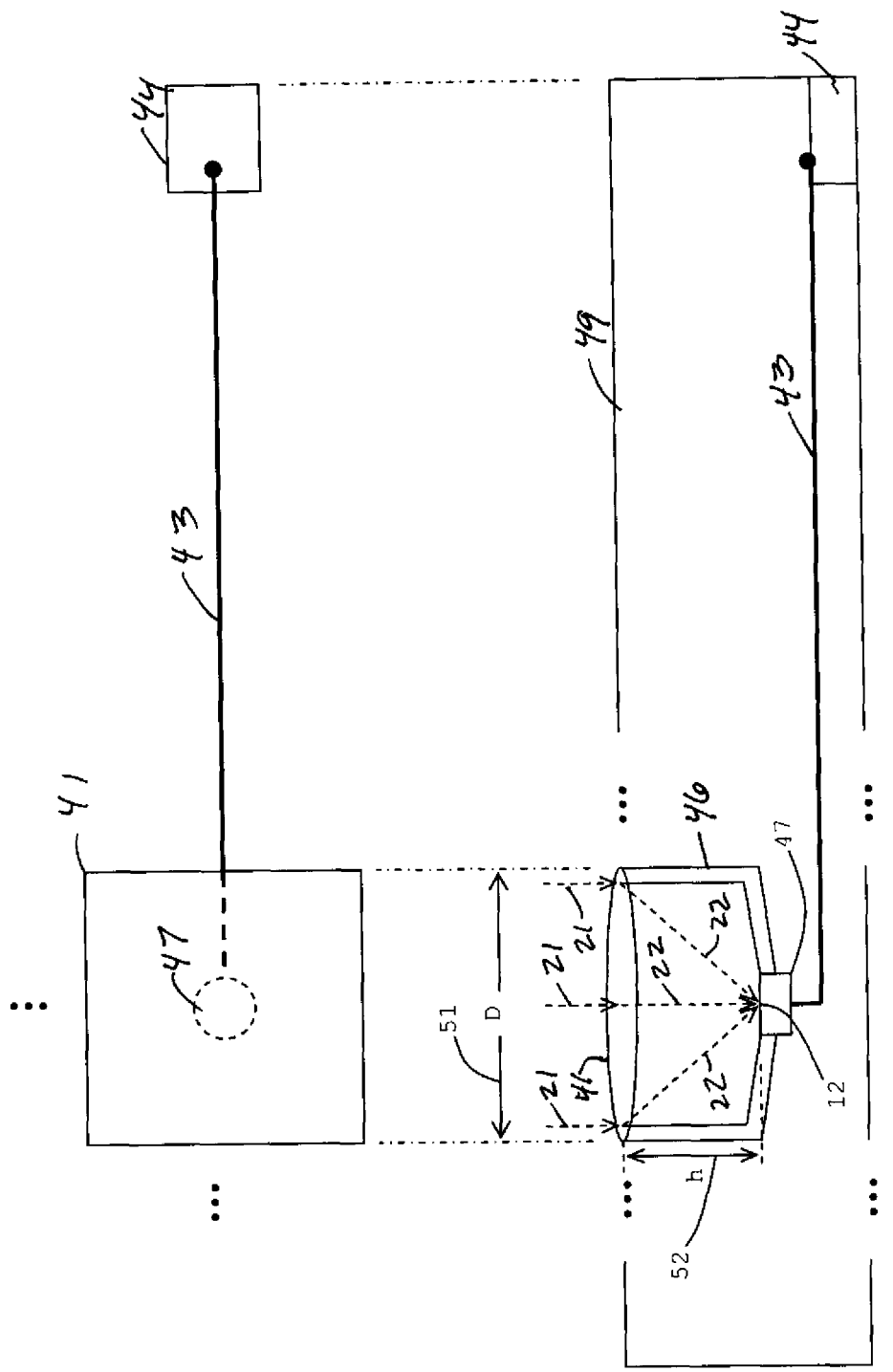
FIG. 6 is a diagram indicating aspects of each lens and its associated components of the array illustrated in FIG. 5.

A collector sheet 49 may have solar cells 47 located proximate to the focal spot 12 of the collecting lenses 41 and have wires 43 going from the cells to the edge of the sheet (FIG. 5 and FIG. 6). The wires may be connected in a desired configuration for electrical power output.

Figure 1:
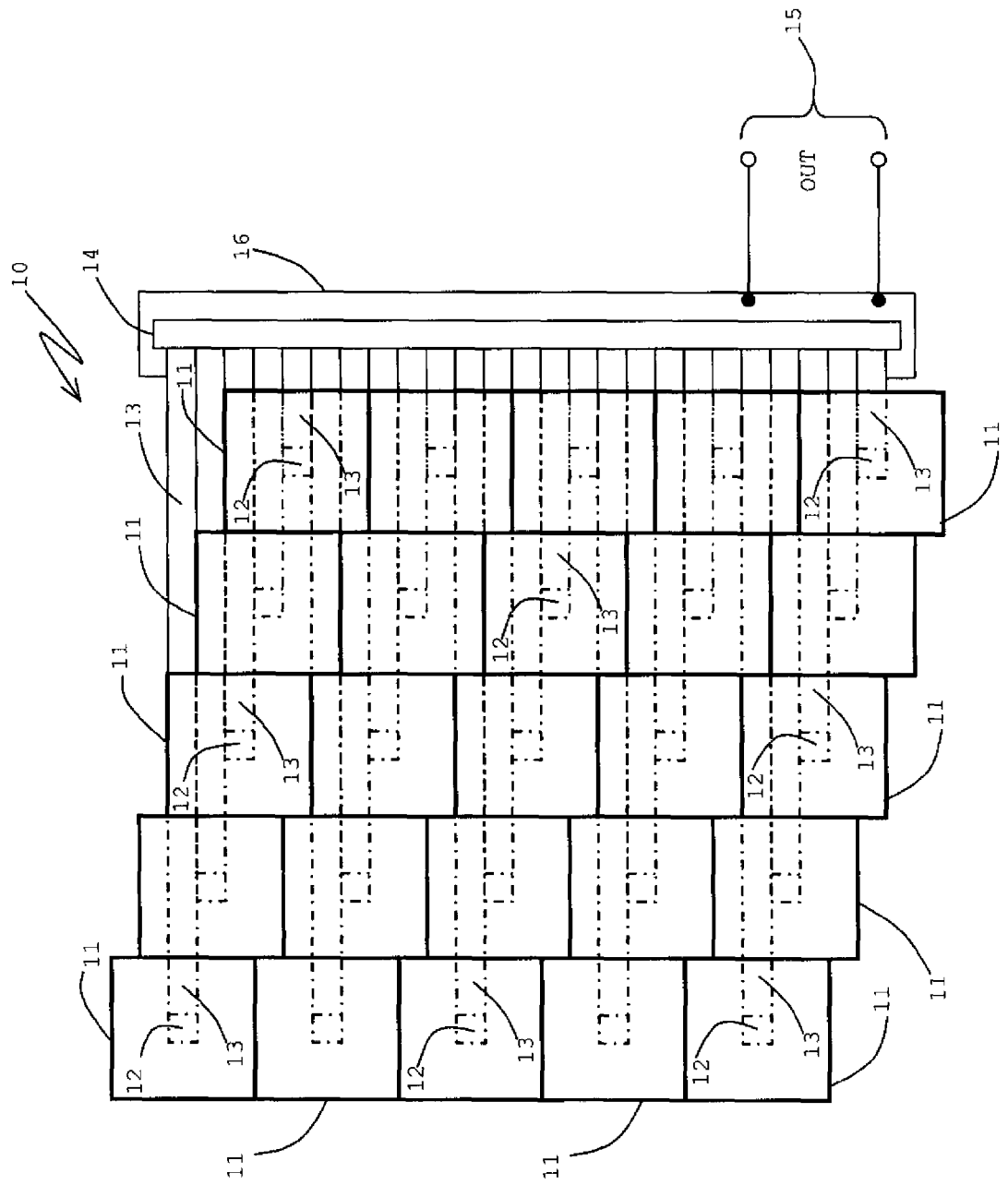
FIG. 1 is a diagram of an illustrative example of a solar collector sheet having an array of collecting lenses.

FIG. 1 is a diagram of an illustrative example 10 of a solar collector sheet. There may be an array of collector lenses 11 that may collect light and focus the light at points 12 at ends 17 of light conveying mechanisms 13, respectively, which may be light waveguides, such as optical fibers. The lenses may be fitted closely together such that the edges of the lenses touch the edges of the other lenses. The light conveying mechanisms may provide light to a strip 14 which may contain a solar cell or a number of solar cells to collect the light for conversion to electrical power at an output 15. If there are a number of solar cells instead of one receiving light for conversion, the cells may be interconnected in a configuration to provide a particular output of certain magnitudes, such as voltage, at output 15. The solar cell or cells 14 may be supported by a block or support structure 16. Block 16 may also provide a place for electrical interconnections of the cells.

Figure 2:
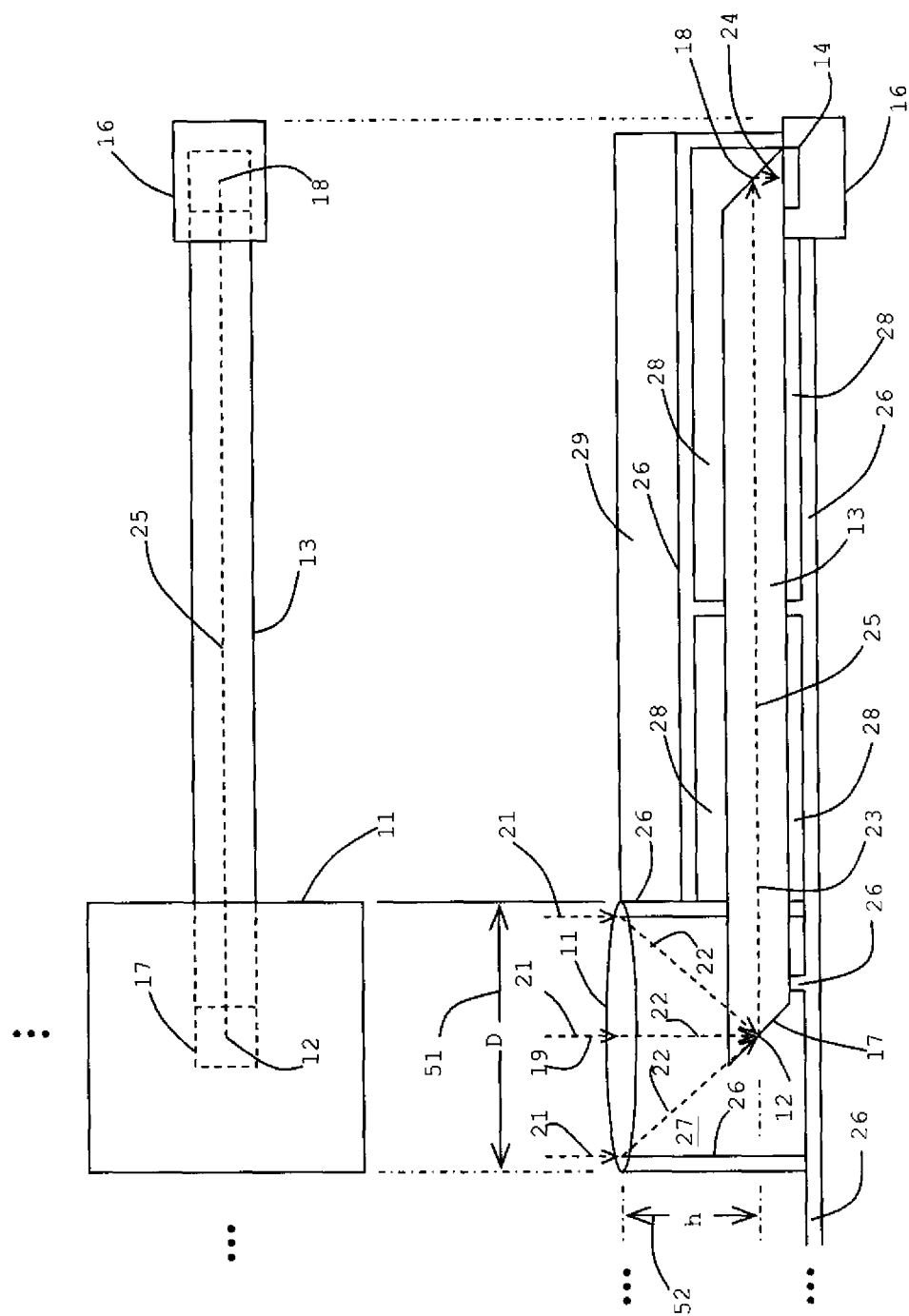
FIG. 2 is a diagram of a component of the collector sheet in FIG. 1.

FIG. 2 is a diagram of a component of the array of the collector sheet 10 in FIG. 1. The light waveguide 13 may be rectangular or round. Waveguide 13 could have some other shape. Light 21 may impinge a collector lens 11 which may focus light 21 as light 22 and coupled into the waveguide to a guide end 17 at focal point 12. End 17 may reflect light 22 as light 23 down waveguide 13. Light 23 may travel to another end 18 of waveguide 13. End 18 may reflect light 23 as light 24 to solar cell 14. End 17 may be cut at about a 45 or so degree angle relative to the elongated portion of waveguide 13. Light 22 at an optical axis 19 of lens 11 may be reflected at about 90 degrees or so relative to optical axis 19. The surface of end 17 of waveguide 13 may have or not have a reflective coating applied. Light 23 may travel approximately along an optical axis 25 which may incorporate a center of the waveguide or core of an optical fiber. Light 23, as it impinges end 18, may be reflected by a surface of end 18 at about 90 degrees or so relative to optical axis 25 towards the solar cell 14. End 18 may be cut at about a 45 or so degree angle relative to the elongated portion of waveguide 13. The surface of end 18 of waveguide 13 may have or not have a reflective coating applied.

Lens 11 may be a Fresnel lens or convex lens having a focal length to point 12 which is equivalent to distance "h" 52 and an optical diameter of "D" 51. Lens 11 may have a low profile in that "h<D". There may be a structure that maintains the focal distance h 52 at a constant value. A structure 26 may hold lens 11 and end 17 of fiber 13 in a manner to maintain the constant value of h. At the same time, structure 26 and waveguide 13 may be pliable without affecting the h value and the paths of light 22, 23 and 24. A volume 27 between lens 11 and end 17 of fiber 14 may contain air or a vacuum. Or volume 27 may be filled with a light transmitting medium. Volume 28 may be filled or not be filled with a pliable material. Volume 29 may be a pliable material. The pliable material and structure 26 permits the array 10 to bend if place on a non-flat surface or to folded or rolled up.

Figure 3:
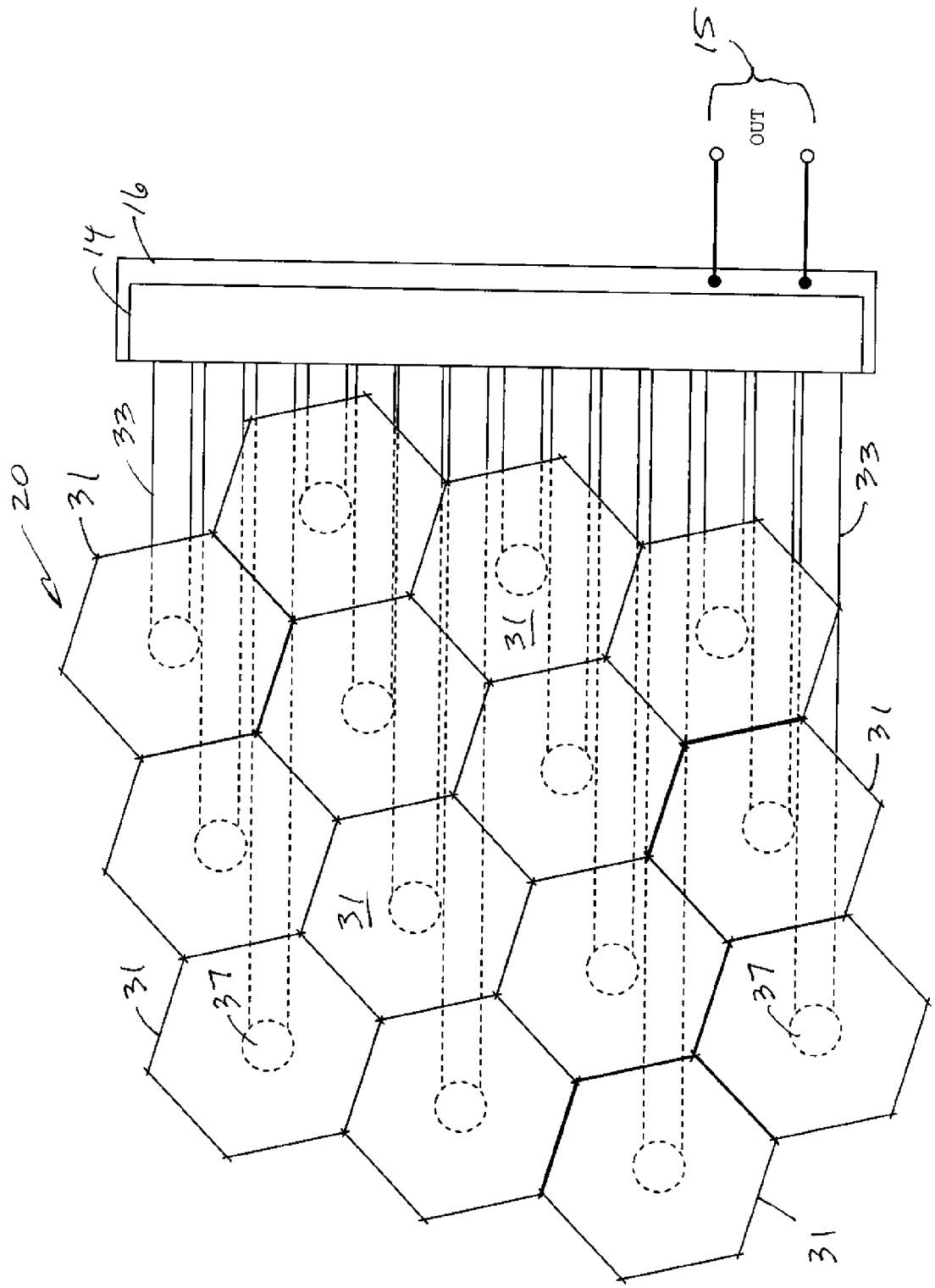
FIG. 3 is a diagram of an array of collector lenses having a hexagon shape.
Figure 4:
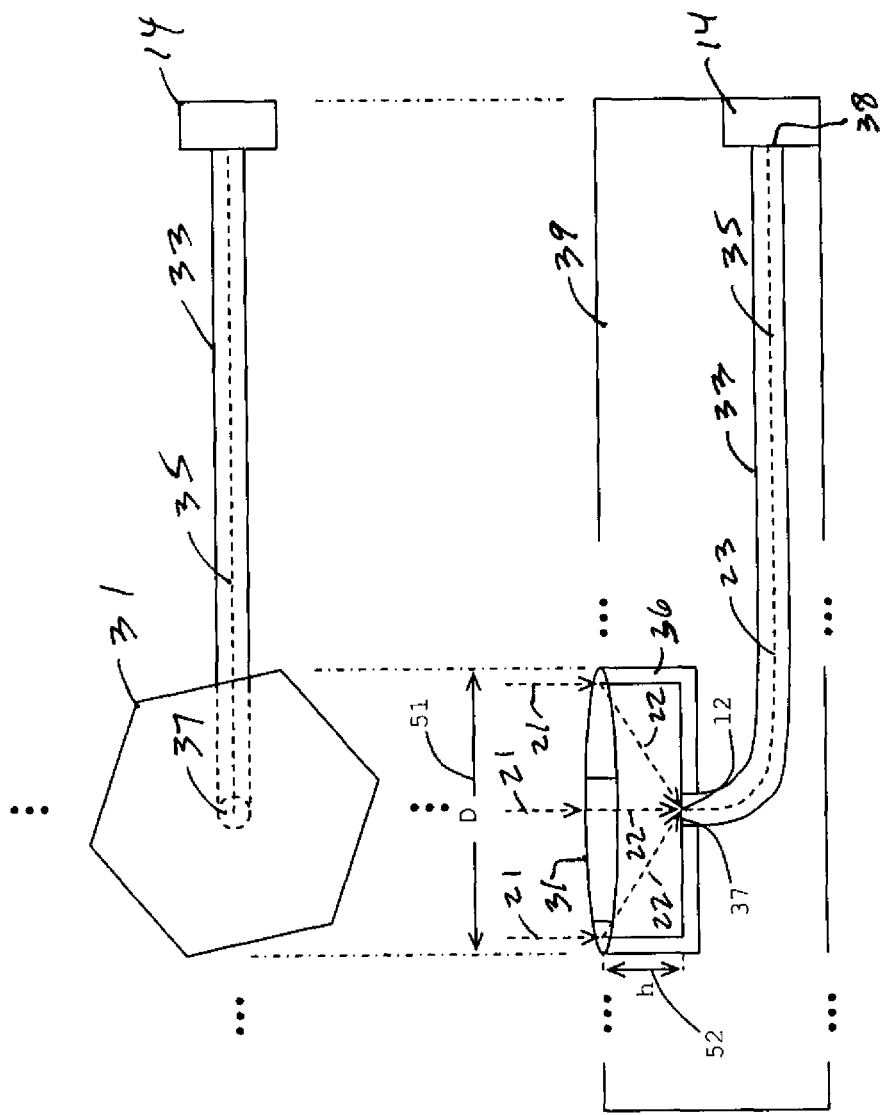
FIG. 4 is a diagram of an example collector of a hexagon shape.

Collector lenses need not be square like lenses 11. Collector lenses may be round, triangular or any other shape. FIG. 3 is a diagram of an array 20 of collector lenses 31 having a hexagon shape. FIG. 4 is a diagram of an example collector of a hexagon shape.

The light conveyance mechanism need not be a waveguide 13 with an end 17 that reflects light 22 from a collector lens through the waveguide 13 and again reflects light 23 at end 18 to a solar cell 14. The light conveyance mechanism may receive light directly into, for example, a waveguide 33 such as an optical fiber without dependence on reflective ends. Light 22 may be focused onto an end 37 which has a surface that is perpendicular to an axis 35 of waveguide 33. Light 23 may propagate down waveguide 33 approximately along a central optical axis or core of waveguide 23 to and through an end 38 directly to a solar cell 14. No end reflection is required with this configuration of the present approach. Even though this configuration is associated with array 20 of FIG. 3, it may be implemented with array 10 in FIG. 1.

Lens 31 and end 37 of waveguide 33 may be structurally supported with a structure 36. The value of h, i.e., the focal length of lens 31 and respective focus of light 22 at end 37 of waveguide 33, may be maintained by structure 36. Still structure 26 and waveguide 33 may be pliable without affecting the positions of lens 31 and end 37 relative to each other. The collector lens 31 and other lenses 31 of array 20, along with the waveguides 33 and structures 36, may be held together with a pliable material 39. The components of the array may be in one approach potted with the material 39, except for the light incoming surfaces of the collector lenses 31. The solar cell or cells 14 may be enclosed or partially enclosed or not enclosed by material 39. The whole array 20, with its components, may be like a flexible sheet which may be folded, rolled up, or lay out to conform to a non-flat surface. This approach may be applicable to other configurations with collector lenses having other shapes.

FIG. 5 is a diagram of another array 30 having square collector lenses 31 like those of array 10 in FIG. 1. However, the light collection and conversion configuration is different for array 30. However, this configuration may be applicable to arrays having configuration lens shapes of various kinds. FIG. 6 is a diagram indicating aspects of each lens 41 and its associated components. Light 21 may enter the collector lens 41 and be focused by the lens as light 22 onto a solar cell 47. Electrical power may be conveyed to a connection block 44 via a conductor 43 to a terminal at the block. Conductor 43 may be interconnected with other conductors 43 in a configuration which can provide a desired output. A focal length h between the collector lens 41 and the sensing surface of solar cell 47 may be held in place with a structure 46. Structures 26 of the array 30 and corresponding conductors 43 may be in one approach potted with a pliable material 49, except for the light incoming surfaces of the collector lenses 41. Structures 26 and the conductors 43 may be enclosed, or partially enclosed, or not enclosed by material 49. The whole array 30, with its components, may be like a flexible sheet which may be folded, rolled up, or laid out to conform to a non-flat surface. This approach may be applicable to other configurations with collector lenses having other shapes. Connection block 44 might or might not be included in the material 49.

Figure 7:
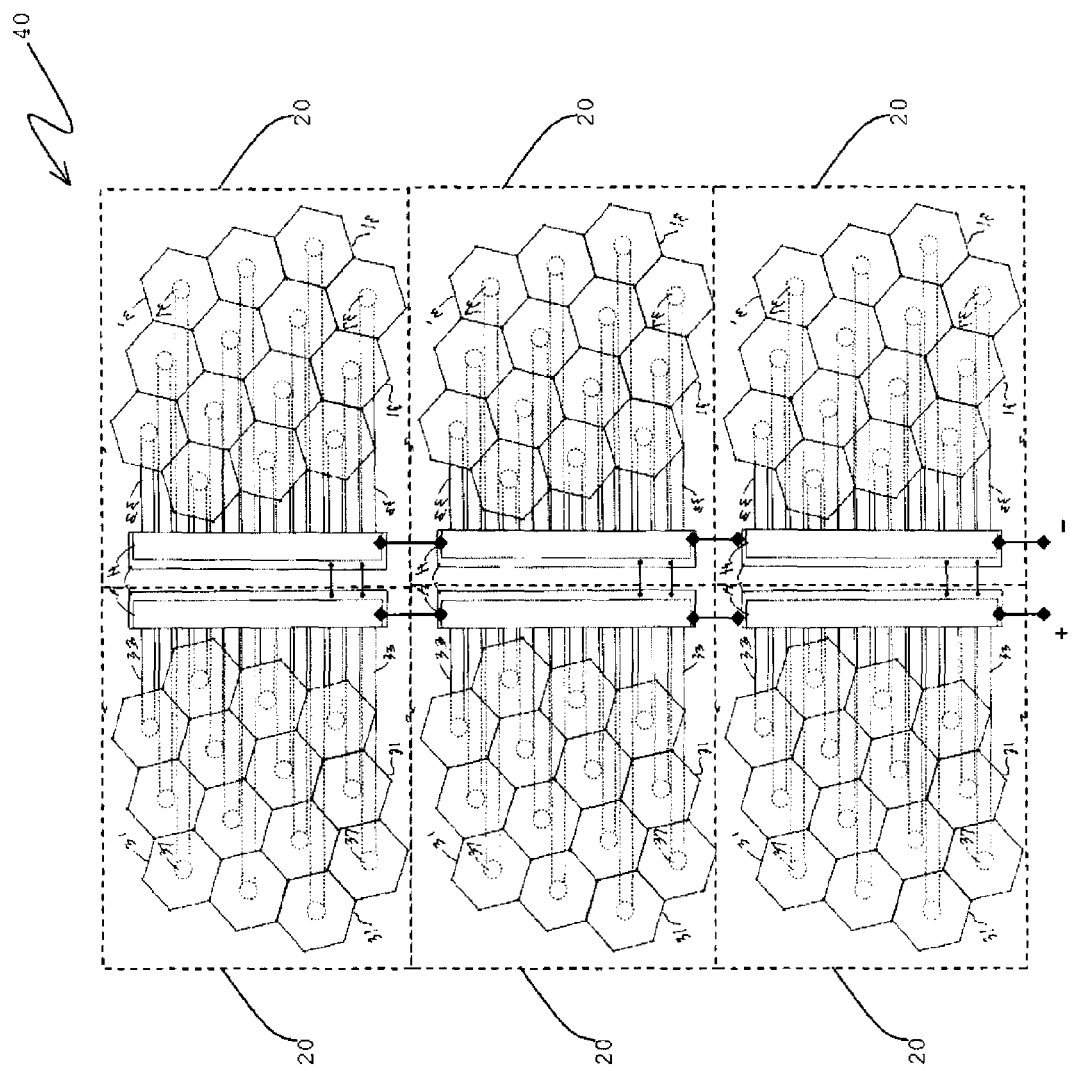
FIG. 7 is a diagram of multiple light collector modules or sheets put together to form a larger sheet for light collection.

Capturing the possibility of using a multiple of collector sheets as modular building blocks (where a block may have limited size and the number of array elements may be limited to the ratio of the lens area to the cross-section area of the waveguide) to construct a larger solar collection sheet. An example is shown in FIG. 7, which is a diagram of a large sheet 40 of modules or sheets of collector lenses with corresponding solar sensing and conversion mechanisms. Each module or sheet may that of module 10 illustrated in FIG. 1, module 20 illustrated in FIG. 3, or module 30 illustrated in FIG. 5. Each module or sheet may instead be of an example not specifically illustrated in a Figure herein. The illustrative example of large sheet 40 may incorporate modules or sheets 20 as shown in FIG. 3. The layout of sheet 40 may have a 3×2 module configuration; however, the layout may have virtually any number of modules in each dimension. The layout of sheet 40 may also incorporate various kinds of modules including those illustrated in FIGS. 1, 3 and 5. The electrical outputs of the modules may be connected to provide one or more outputs as desired.

In the present specification, some of the matter may be of a hypothetical or prophetic nature although stated in another manner or tense.

Although the present system has been described with respect to at least one illustrative example, many variations and modifications will become apparent to those skilled in the art upon reading the specification. It is therefore the intention that the appended claims be interpreted as broadly as possible in view of the prior art to include all such variations and modifications.

What is claimed is:

1. A low profile light concentrator array comprising:
   a pliable sheet capable of being folded or rolled up;
   a plurality of concentrator units formed in the sheet; and
   a solar cell arrangement for receiving light from the plurality of concentrator units; and wherein:
   each concentrator unit comprises:
   a light conveyance mechanism;
   a light collection lens for focusing light impinging a first surface of the lens onto a first end of the light conveyance mechanism which reflects the light through the light conveyance mechanism; and
   a second end of the light conveyance mechanism is proximate to the solar cell arrangement for receiving the light from the light conveyance mechanism; and
   wherein the lens has a focal length and the pliable sheet is capable of being folded or rolled up without affecting the focal length of the light collection lens.

2. The array of claim 1, wherein the first end of the light conveyance mechanism comprises a reflecting surface for redirecting impinging light from one direction to another direction to enter the light conveyance mechanism.

3. The array of claim 2, wherein the second end of the light conveyance mechanism comprises a reflecting surface for redirecting light from one direction to another direction from the light conveyance mechanism to the solar cell arrangement.

4. The array of claim 1, wherein the solar cell arrangement is situated at an edge of the sheet.

5. The array of claim 1, wherein the light collection lens has a maximum lateral dimension approximately perpendicular to the focal length dimension of the light collector lens; the focal length dimension is a distance between the lens to the first end of the light conveyance mechanism; and the maximum lateral dimension is greater than the focal length dimension.

6. A light collection and conversion system comprising:
a flexible structure capable of being folded or rolled up; and
a plurality of concentrator units situated adjacent to one another in the flexible structure; and
wherein each concentrator unit comprises:
   a light-to-electric converter;
   a refracting mechanism having a maximum lateral dimension width approximately perpendicular to an optical axis of the refracting mechanism, wherein a focal length dimension along the optical axis of the refracting mechanism is less than the maximum lateral dimension; and
   a light conveyance mechanism having a first end situated at a focal point of the refracting mechanism and a second end coupled to the light-to-electric converter.

7. The system of claim 6, further comprising a connection block.

8. The system of claim 6, wherein each light refracting mechanism is adjacent to one or more other light refracting mechanisms of the plurality of concentrator units.

9. A light collection system comprising:
one or more low profile solar concentrators; and
wherein each low profile solar concentrator comprises:
   a holding material in a form of a pliable sheet capable of being foldable or rolled up;
   two or more concentrator units situated adjacent to one another in the holding material; and
   a light-to-electric converter; and
wherein each concentrator unit comprises:
   a lens having a maximum lateral length approximately perpendicular to an optical axis of the lens and a focal length along the optical axis of the lens is less than the maximum lateral length; and
   a light waveguide having a first end proximate to a focal point of the lens and a second end proximate to the light-to-electrical converter.

10. The system of claim 9, wherein the lens of each concentrator unit has edges adjacent to lenses of one or more proximate concentrator units; and the lenses of the two or more concentrator units are situated relative to one another in a form of an array.

11. The system of claim 9, wherein the first end of the light waveguide of a concentrator unit has a reflecting surface located at the focal point of the lens; and
the reflecting surface has an angle relative to an optical axis of the lens so as to reflect light from the lens into an elongated portion of the waveguide for propagation of the light to the second end.

12. The system of claim 9, wherein each concentrator unit further comprises a structure for holding the lens and the first end of the waveguide at a fixed distance.

13. The system of claim 10, wherein:
the lenses comprise a plastic; and
the holding material comprises a polymer.

14. The system of claim 11, wherein the light waveguide is an optical fiber.

* * * * *